(12) United States Patent
Jacobs et al.

(10) Patent No.: US 10,370,760 B2
(45) Date of Patent: Aug. 6, 2019

(54) METHODS FOR GAS GENERATION IN A SEALED GAS CELL CAVITY

(71) Applicant: Texas Instruments Incorporated, Dallas, TX (US)

(72) Inventors: Simon Joshua Jacobs, Lucas, TX (US); Juan Alejandro Herbsommer, Allen, TX (US); Adam Joseph Fruehling, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/843,313

(22) Filed: Dec. 15, 2017

(65) Prior Publication Data

US 2019/0186007 A1 Jun. 20, 2019

(51) Int. Cl.
| | |
|---|---|
| *C23C 16/455* | (2006.01) |
| *B29C 65/14* | (2006.01) |
| *C23C 16/56* | (2006.01) |
| *C23C 16/40* | (2006.01) |
| *B29C 65/00* | (2006.01) |
| *G04F 5/14* | (2006.01) |
| *H03L 7/26* | (2006.01) |
| *B29L 31/34* | (2006.01) |

(52) U.S. Cl.
CPC ........ *C23C 16/45525* (2013.01); *B29C 65/14* (2013.01); *B29C 66/034* (2013.01); *B29C 66/112* (2013.01); *C23C 16/403* (2013.01); *C23C 16/56* (2013.01); *G04F 5/14* (2013.01); *H03L 7/26* (2013.01); *B29L 2031/34* (2013.01); *H05K 2201/09836* (2013.01)

(58) Field of Classification Search
CPC ... G01C 21/3641; G06F 3/167; G10L 13/033; G10L 13/043; G10L 15/1822; G10L 15/187; G10L 15/22; G10L 15/265; G10L 17/26; G10L 2015/223; G10L 2015/226; G10L 25/51; C23C 16/45525; C23C 16/56; B29C 65/14; H05K 2201/09836; H01L 45/1685
USPC .................. 216/17, 18, 24, 33; 427/557, 558
See application file for complete search history.

(56) References Cited

U.S. PATENT DOCUMENTS

| | | |
|---|---|---|
| 3,388,339 A | 6/1968 | Malnar et al. |
| 7,292,111 B2 | 11/2007 | Abbink et al. |
| (Continued) | | |

FOREIGN PATENT DOCUMENTS

| | | |
|---|---|---|
| WO | 2017009582 | 1/2017 |

OTHER PUBLICATIONS

Deegan et al., "Capillary Flow as the Cause of Ring Stains from Dried Liquid Drops", Letters to Nature, Nature, vol. 389, Oct. 23, 1997, Macmillan Publishers Ltd., pp. 827-829.

(Continued)

*Primary Examiner* — Lan Vinh
(74) *Attorney, Agent, or Firm* — Michael A. Davis, Jr.; Charles A. Brill; Frank D. Cimino

(57) ABSTRACT

Described examples include a method of fabricating a gas cell, including forming a cavity in a first substrate, providing a nonvolatile precursor material in the cavity of the first substrate, bonding a second substrate to the first substrate to form a sealed cavity including the nonvolatile precursor material in the cavity, and activating the precursor material after or during forming the sealed cavity to release a target gas inside the sealed cavity.

18 Claims, 8 Drawing Sheets

(56) References Cited

U.S. PATENT DOCUMENTS

| | | | |
|---|---|---|---|
| 8,217,724 B2 | 7/2012 | Briggs et al. | |
| 8,588,557 B2* | 11/2013 | Schmidt | G01N 21/3103 |
| | | | 356/432 |
| 8,624,682 B2 | 1/2014 | Ridley et al. | |
| 8,680,854 B2 | 3/2014 | Dyer et al. | |
| 8,836,327 B2 | 9/2014 | French et al. | |
| 8,906,470 B2* | 12/2014 | Overstolz | G04F 5/14 |
| | | | 427/235 |
| 9,201,404 B2 | 12/2015 | Harasaka et al. | |
| 9,529,334 B2 | 12/2016 | Herbsommer et al. | |
| 9,639,062 B2 | 5/2017 | Dyer et al. | |
| 2005/0007118 A1 | 1/2005 | Kitching et al. | |
| 2005/0271250 A1 | 12/2005 | Vallone et al. | |
| 2006/0022761 A1 | 2/2006 | Abeles et al. | |
| 2007/0247241 A1 | 10/2007 | Braun et al. | |
| 2008/0218281 A1 | 9/2008 | Lipp et al. | |
| 2010/0156547 A1 | 6/2010 | McGuyer et al. | |
| 2010/0189605 A1 | 7/2010 | Schmid et al. | |
| 2013/0015850 A1 | 1/2013 | Lindorfer et al. | |
| 2013/0044921 A1 | 2/2013 | In et al. | |
| 2013/0147472 A1 | 6/2013 | French et al. | |
| 2013/0176703 A1 | 7/2013 | Hopper et al. | |
| 2014/0347074 A1 | 11/2014 | Nadeau | |
| 2014/0368377 A1 | 12/2014 | Nadeau et al. | |
| 2014/0373599 A1 | 12/2014 | Trombley et al. | |
| 2015/0001694 A1 | 1/2015 | Hopper et al. | |
| 2015/0027908 A1 | 1/2015 | Parsa et al. | |
| 2015/0028866 A1 | 1/2015 | Parsa et al. | |
| 2015/0084707 A1 | 3/2015 | Maki | |
| 2015/0244382 A1 | 8/2015 | Ishihara | |
| 2016/0291549 A1* | 10/2016 | Herbsommer | G01N 29/36 |
| 2017/0194977 A1* | 7/2017 | Dyer | H03L 7/26 |

OTHER PUBLICATIONS

Gelderblom, "Fluid Flow in Drying Drops", Henneke Gelderblom, Physics of Fluids, Univ. of Twente, Enschede, The Netherlands, Apr. 19, 2013, 152 pgs.

Hasegawa et al., "Microfabrication of Cesium Vapor cells with Buffer Gas for MEMS Atomic Clocks", Sensors and Actuators A 167 (2011): Physical, Elsevier, pp. 594-601.

Woetzel et al., "Microfabricated Atomic Vapor Cell Arrays for Magnetic Field Measurements", Review of Scientific Instruments 82, 033111 (2011, downloaded May 26, 2011 to 129.215.149.92). American Institute of Physics, 4 pgs.

International Search Report for PCT/US2018/064986 dated Apr. 29, 2019.

* cited by examiner

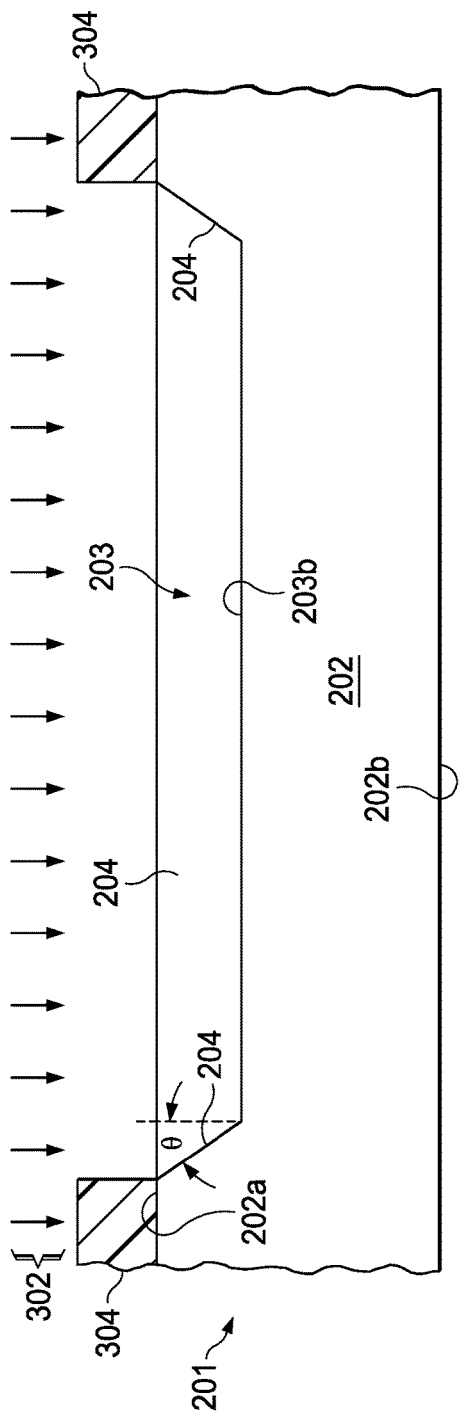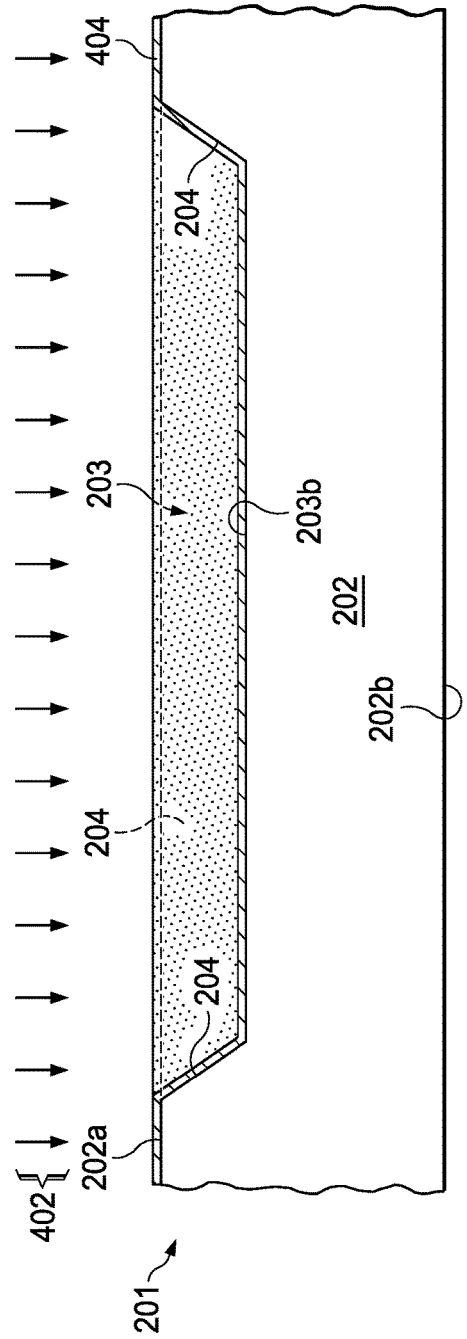
FIG. 3
FIG. 4

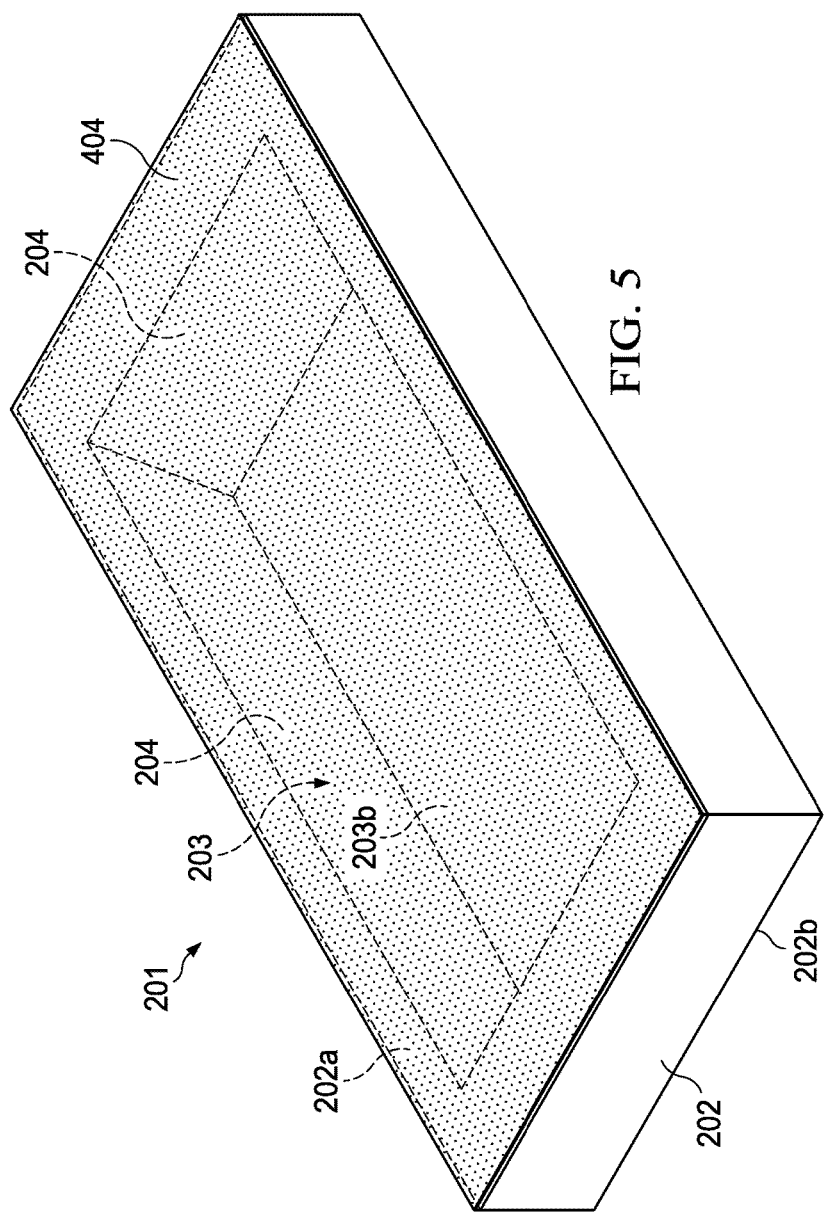
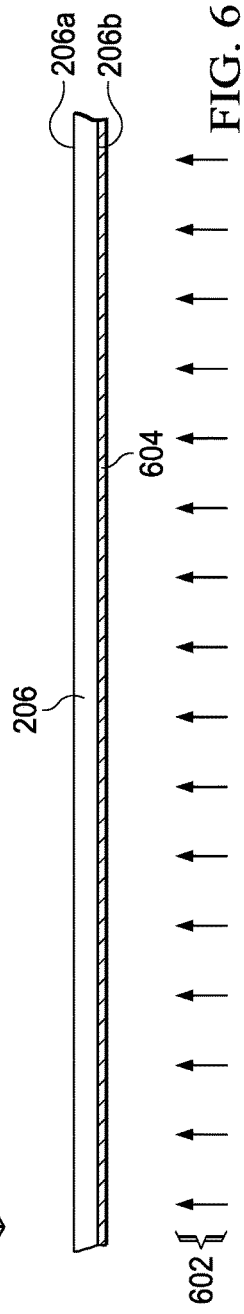

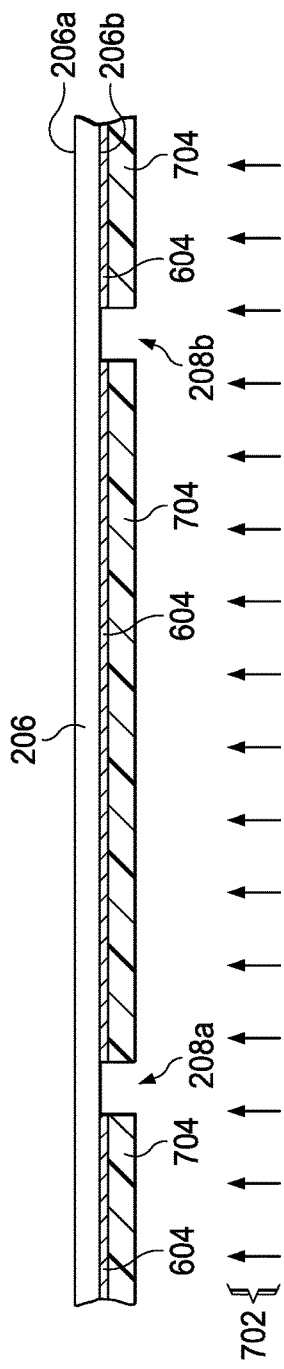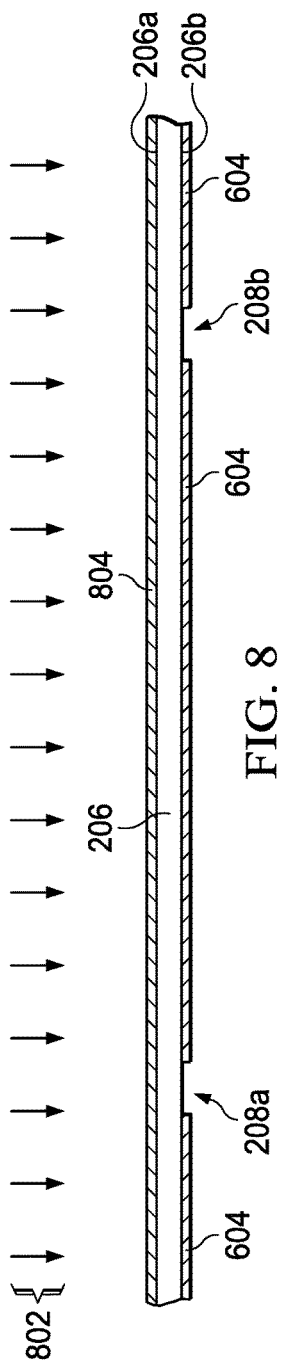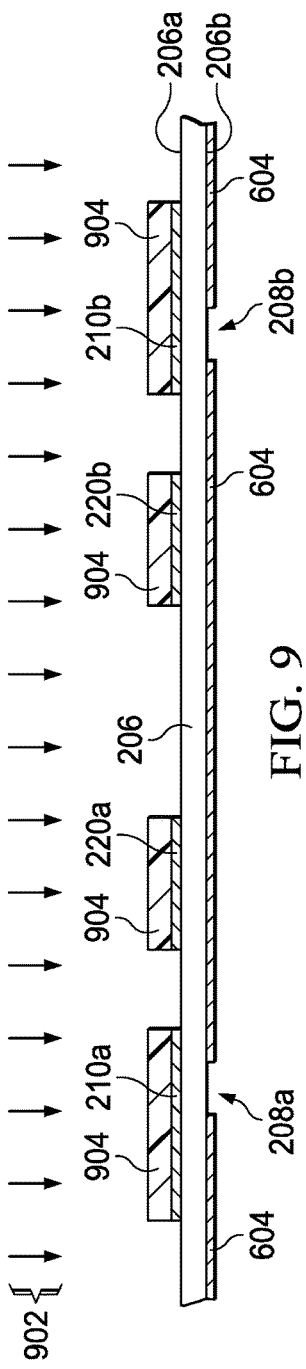

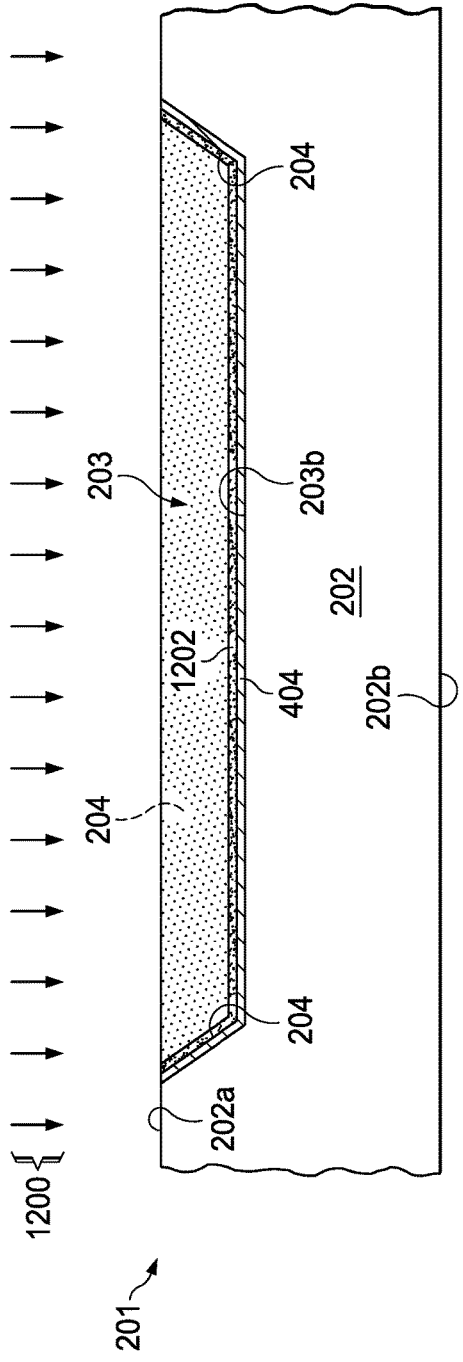
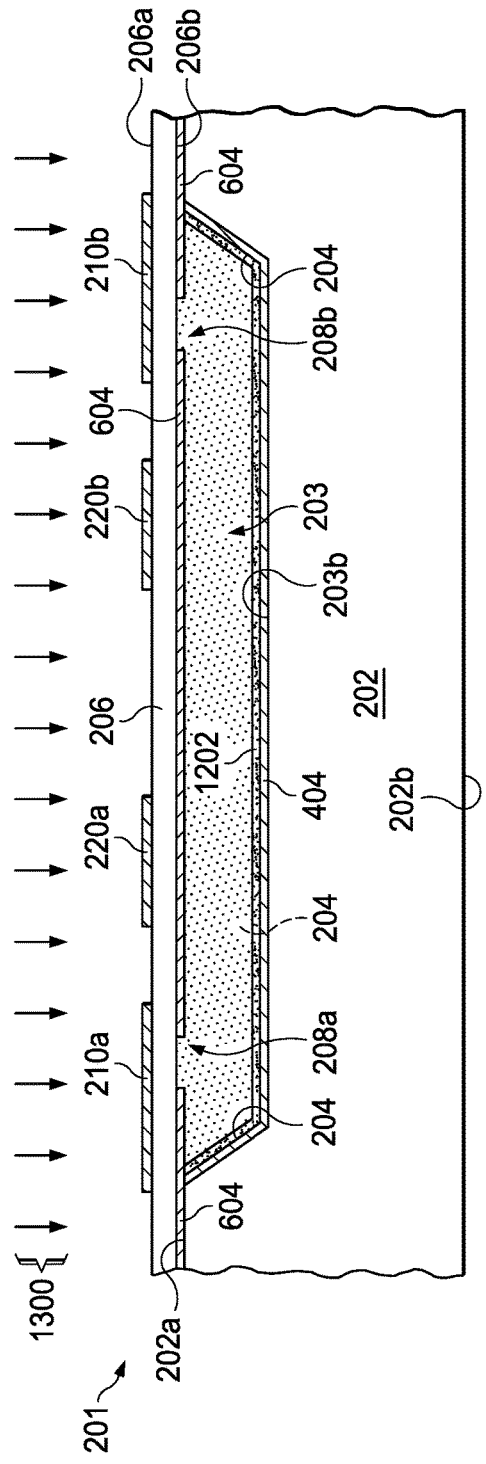

METHODS FOR GAS GENERATION IN A SEALED GAS CELL CAVITY

BACKGROUND

In the microwave to millimeter wave (mm-wave) region, molecular spectroscopy is useful for constructing microwave or millimeter wave atomic clocks and other systems that require accurate timing signals. Atomic clocks excite the gas within a gas cell using a laser or mm-wave radiation induced by a RF transceiver, and the system detects the rotational quantum transition of dipolar molecules for a reference. The gas cell is ideally a hermetically sealed environment, including a desired target gas at a stable low pressure. By using advanced mass flow controllers and similar apparatus during sealing of the gas cell cavity, a moderate vacuum environment is practical to produce while simultaneously controlling a known amount of a volatile species. However, during cavity sealing operations, controlling the environmental conditions can be difficult and expensive.

SUMMARY

To fabricate a gas cell and generate a target gas inside a sealed cavity, example methods include forming a cavity in a first substrate, providing a nonvolatile precursor material in the cavity, bonding a second substrate to the first substrate to form the sealed cavity including the nonvolatile precursor material in the cavity, and activating the precursor material after or during the formation of the sealed cavity to release the target gas inside the sealed cavity.

To generate a target gas inside a sealed cavity, an example method includes providing a nonvolatile precursor material in a cavity of a first substrate, bonding a second substrate to the first substrate to seal the cavity including the nonvolatile precursor material, and activating the precursor material after or during the seal of the cavity to release the target gas inside the sealed cavity.

BRIEF DESCRIPTION OF THE DRAWINGS

FIG. 3 is a partial side elevation view of a first substrate undergoing an etch process to form a cavity.

FIG. 4 is a partial side elevation view of the first substrate undergoing a deposition operation to form a conductive material on the cavity bottom and sidewalls.

FIG. 5 is a perspective view of the first substrate with a conductive interior cavity surface.

FIG. 6 is a partial side elevation view of a second substrate undergoing a deposition process to form a conductive material on a bottom side thereof.

FIG. 7 is a partial side elevation view of the second substrate undergoing an etch process to form non-conductive apertures through the conductive material on the bottom side.

FIG. 8 is a partial side elevation view of the second substrate undergoing a deposition process to form a conductive material on the top side thereof.

FIG. 9 is a partial side elevation view of the second substrate undergoing an etch process to form first and second conductive coupling structures and electronic bandgap structures on the top side.

FIG. 12 is a partial side elevation view of the first substrate undergoing a deposition operation to form a precursor on the cavity bottom and sidewalls.

FIG. 13 is a partial side elevation view of the first and second substrates undergoing a wafer bonding process to seal the cavity.

DETAILED DESCRIPTION

Figure 1:
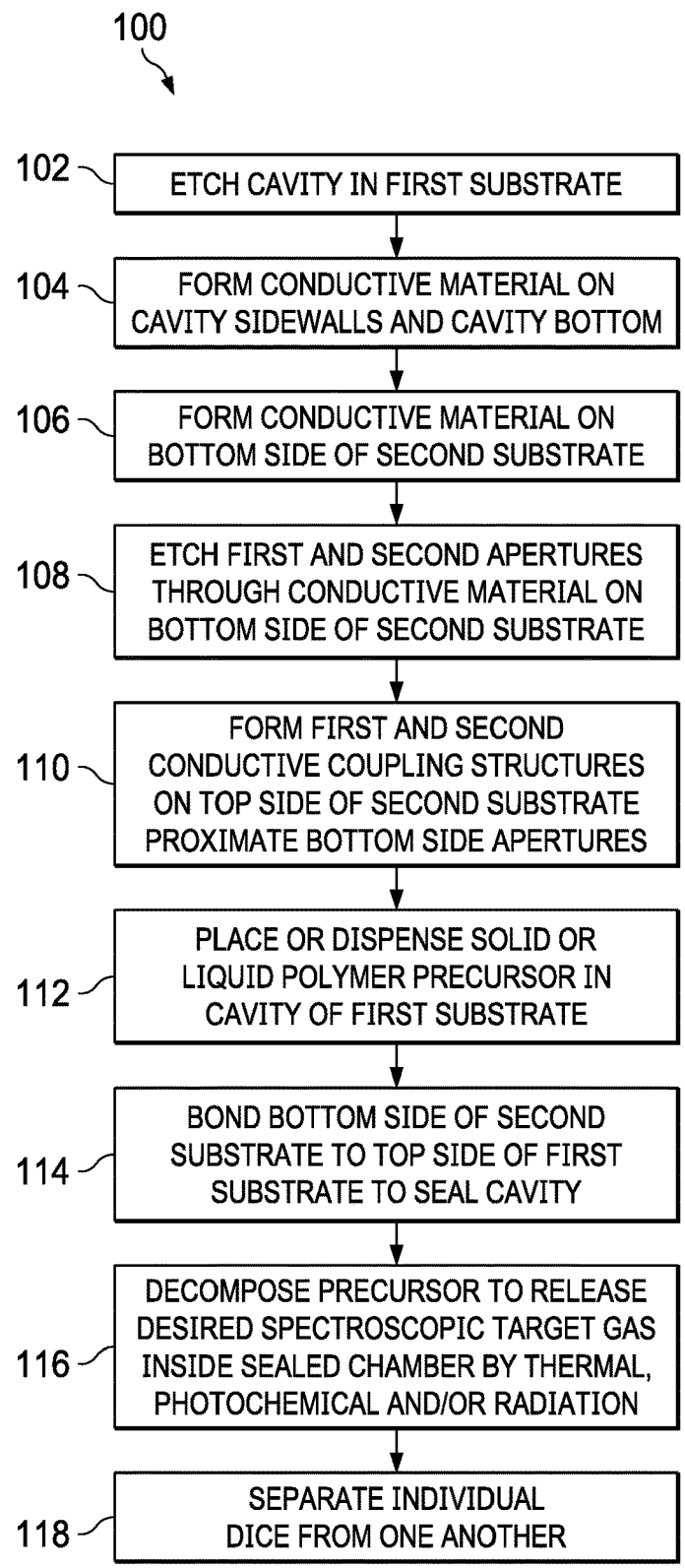
FIG. 1 is a flow diagram of a method of fabricating a gas cell.

In the drawings, like reference numerals refer to like elements throughout, and the various features are not necessarily drawn to scale.

Figure 2:
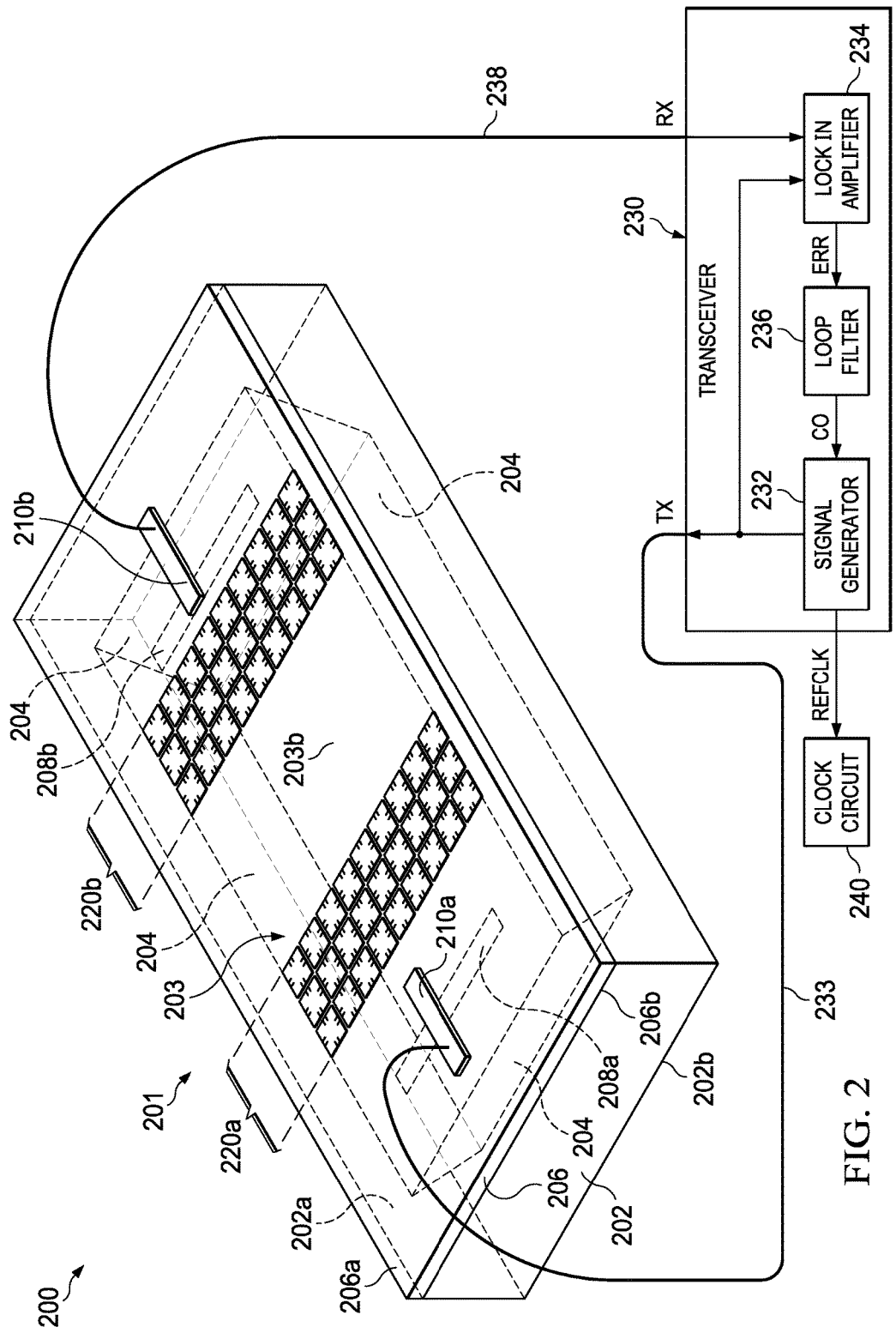
FIG. 2 is a partial perspective view of a rotational transition based clock apparatus with a dipolar molecule gas cell and an associated transceiver circuit for providing a reference clock signal.

FIG. 1 shows a method 100 of fabricating a gas cell and generating a desired target gas inside a sealed cavity. FIG. 2 shows a rotational transition based clock apparatus 200 with a dipolar molecule gas cell 201 and an associated transceiver circuit 230 for providing a reference clock signal. The method 100 can be used with a variety of target gas cell gases to provide compact, energy efficient rotational transition clock systems 200, using low-cost packaging and fabrication processes to facilitate wafer scale or chip scale rotational spectroscopy cells or gas cells 201 in a silicon-based process. Those cells are useful in atomic clocks and other applications.

Target gas molecules (e.g., water or $H_2O$) have defined quantum rotational state transitions, and such molecules absorb energy at a very repeatable frequency when transitioning between rotational states. For example, water absorbs energy based on quantum rotational state transitions at 183.31 GHz. In at least one example, clock apparatus 200 in FIG. 2 includes a gas cell 201 fabricated in a silicon-based process, which does not require lasers, modulators, photo detectors and other optical components and does not require associated temperature stabilization (e.g., heating) components. Further, the chip scale gas cells 201 can be combined with, or interconnected with, simple transceiver circuitry as shown in FIG. 2 to implement a cost effective and power efficient transition based atomic clock. In example embodiments, the atomic clock is operable at much lower frequencies than electronic transition atomic clock designs, and it uses a single relatively simple control loop, thereby mitigating the complex control techniques of conventional atomic clock architectures.

Organic and inorganic target gases are useful reference standards for molecular spectroscopy in the microwave to millimeter wave region, and can be polled by appropriate frequencies of electromagnetic radiation. Linear rigid rotor molecules are useful as reference standards, because these gasses include atoms that nominally lie along a single line within three dimensional space and whose bond angles are all approximately 180 degrees. Although the bond angles may vary slightly due to molecular vibrations, the structural formulae for all of these can be considered to be linear. For preferred gas cell operation, the gas is ideally at a relatively low pressure, such as approximately 100 mTorr or less.

Low gas pressure reduces the effects of pressure broadening due to intermolecular collisions. Also, low gas pressure decreases the linewidths of the observed spectral lines. This leads to very sharp transitions and good frequency stability, such as in the parts per trillion range or better. The transitions can be used as references for a variety of very accurate timing devices including clock circuits. However, difficulties can arise in practically producing a moderate vacuum environment while simultaneously controlling a known amount of a volatile species, especially without using advanced mass flow controllers.

Referring to FIG. 1, the example method 100 provides the gas in a precursor, nonvolatile form. The gas is released in a controlled manner after the cavity is sealed or during a sealing step. Inside the waveguide cavity, solid dielectric precursor materials neither perturb signal propagation nor significantly affect the system's signal-to-noise ratio. In some examples, solid or dissolved precursors are used to vapor phase organic and inorganic gasses. The precursor can be deposited on one or more interior faces of the waveguide cavity before sealing. When heated at temperatures above the sealing temperature, the precursor releases the desired spectroscopic target through chemical reaction.

FIGS. 1 and 3-14 show wafer scale or chip scale fabrication techniques to produce gas cells 201 and atomic clock systems 200, by using silicon or other semiconductor-based integrated circuit processes for compact, low power, and cost effective solutions. FIG. 1 shows a method 100 of fabricating a gas cell 201. Various interconnection techniques are possible for subsequently integrating the produced gas cell 201 with a transceiver circuit 230 to provide a clock system 200 as shown in FIG. 2. FIGS. 3-14 show the example gas cell 201 at various stages of fabrication processing according to the method 100. The example process 100 facilitates direct packaging of a compact chip scale gas cell 201 or physics cell having a low-pressure dipolar molecule gas in a mm-wave waveguide cavity 203, which can be packaged with a transceiver die via wire bonding, flip chip, or other packaging techniques.

The method 100 in FIG. 1 begins at 102 with formation of a cavity 203 in a first (e.g., top) side 202a of a first substrate 202. In one example, the first substrate is a silicon wafer. Other substrate materials, such as glass, can be used in various examples. Any suitable wet or dry etch processing 302 can be used as shown in FIG. 3 for the cavity formation at 102 in FIG. 1. In some examples, multiple cavities 203 can be formed in a single substrate 202, such as for creating multiple gas cells 201, with eventual die separation used to separate the individual gas cells 201 from one another at 118 in FIG. 1.

The shape of the cavity 203 is formed at 102 by patterning using a hard mask 304 as shown in FIG. 3. Other examples can use a polymeric resist, which is specifically formulated to resist the etchant (e.g., Brewer Science ProTek family of resists), together with bulk anisotropic etching of the silicon substrate 202 via process 302, such as using strong caustic etchants (such as KOH or TMAH). The etch process 302 forms at least one sidewall 204 along with a cavity bottom 203b having a generally smooth surface. In some examples, the process 302 provides a cavity bottom and sidewall roughness below approximately 5 μm RMS for reducing electromagnetically induced current losses in operation of the gas cell 201. In another example, the etch process 302 etches through the silicon substrate 202 down to a buried etch stop layer (not shown), which may be formed by directly bonding a first substrate including silicon to a second substrate (not shown). For example, the second substrate may be formed of silicon or another material (e.g., glass). Also, a dielectric layer (e.g., silicon dioxide or silicon nitride) may be formed between the first and second substrates. Such a direct bond may be achieved by several methods known for wafer bonding, where one example uses low-temperature plasma activated fusion bonding for lowest cost and high throughput. After the cavity formation at 102 in FIG. 1 and etch process 302 in FIG. 3, any required mask 304 is removed, and clean up processing may be performed. In some examples, a dielectric layer may be formed on the cavity walls 204 and on the cavity bottom 203b for enhancing the adhesion of subsequently deposited metal materials using any suitable deposition process, such as vapor phase deposition, sputtering, chemical vapor deposition (CVD), atomic layer deposition (ALD), etc, where one suitable dielectric layer is Tantalum pentoxide ($Ta_2O_5$) or Titanium for good adhesion to copper.

The method 100 continues to 104 in FIG. 1, which forms a conductive material 404 on at least one sidewall 204 and the cavity bottom 203b or over any deposited dielectric layer, using a deposition process 402 as shown in FIG. 4. FIG. 5 shows the resulting first substrate 202 after the conductive material deposition process 402 of FIG. 4, with conductive material 404 formed on the sidewalls 204 and on the cavity bottom 203b and on the top side 202a of the first substrate 202. In one example, the deposited conductive material 404 is gold or copper, and the surface roughness is approximately 100 nm or less for minimizing losses due to currents induced by the electromagnetic field inside the cavity 203. One suitable deposition process 402 is sputtering of gold or copper metal onto a deposited dielectric layer to achieve high conductivity, absence of long-range magnetic order, good adhesion to $Ta_2O_5$, and low cost. Other metal materials can be used in different examples, such as those having a similar combination of characteristics.

After the sputter deposition 402 in one example, the metal layer 404 may be grown to a desired uniform thickness with copper or any other metal that may be desired, such as using electroplating for reduced deposition cost. In some examples, the formed metal layer may be coated with a dielectric material via vapor phase deposition or other suitable process, where the optional dielectric material is selectable to mitigate reaction of the vapor phase molecules of the gas cell 201 with the metal layer during the expected product lifetime. Any included dielectric may be removed by patterning and etching from all or a target bonding portion of the top surface 202a of the first substrate 202 to facilitate bonding with a second substrate 206 to close or seal the cavity 203 as described further hereinbelow. In this example, the conductive material is formed on the sidewalls 204 and the cavity bottom 203b at 104 (FIG. 1) to a thickness greater than the skin depth at the frequency of operation of the finished gas cell 201, such as approximately 100 nm or more and approximately 1 μm or less to provide a surface roughness of approximately 50 nm or less (e.g., for mitigating signal losses in the cavity 203).

Further, the method 100 includes forming 106 a conductive material 904 on a bottom side 206b of a second substrate 206. As shown in FIG. 6, a second substrate 206 includes a first or top side 206a and a second or bottom side 206b. A conductive material 604 is formed on the bottom side 206b of the second substrate 206 using a deposition process 602 as shown in FIG. 6. The second substrate 206 will later be used to form a cavity top through bonding with the first substrate 202. The substrate 206 can be any suitable material, such as a glass or ceramic wafer having a thickness less than a wavelength of the gas cell operating frequency (e.g., less than 0.5 mm in one example). In practice, suitable second substrates 206 are thin enough to facilitate good electromagnetic coupling of microwave energy through the apertures 208 to and from the cavity 203, and thick enough to mitigate or avoid structural distortion when bonded to the first substrate 202 to seal the cavity 203 under vacuum. In this regard, the second substrate material preferably provides good electromagnetic transmissivity through subsequently patterned non-conductive apertures 208 formed in the material 604 as described hereinbelow. One suitable example material is Corning Eagle XG glass, a low-alkali borosilicate glass available in wafer form of thicknesses ranging from 0.2-3.0 mm. In some examples, the second substrate 206 is coated with a dielectric (e.g., $Ta_2O_5$ or Titanium) on each side 206a and 206b for improving adhesion of metal films, which are later formed over the dielectric.

As shown in FIGS. 6-10, the conductive material deposition and patterning can be done separately for the first and second sides 206a and 206b. In one alternative example, the top and bottom sides 206a and 206b can be completely metalized in one step, followed by a subsequent selective patterning to leave the desired conductive and non-conductive regions on both sides 206a and 206b. In the illustrated example, the bottom side 206b is etched at 108 of FIG. 1 via an etch process 702 using a mask 704 as shown in FIG. 7 to form first and second spaced apertures 208a and 208b, respectively, through the conductive material 604 on the bottom side 206b, with the remainder of the bottom side 206b remaining coated with the conductive material 604. These apertures or slots 208 form part of the electromagnetic coupling structure that will allow an electromagnetic field to enter and exit the cavity 203 in the finished gas cell 201, as described hereinabove in connection with FIG. 2.

The method 100 further includes forming 110 first and second conductive coupling structures 210a and 210b on the first side 206a of the second substrate 206, proximate to the corresponding apertures 208a and 208b formed along the bottom side 206b, as shown in FIGS. 11-14. In FIG. 8, a deposition process 802 is used to plate the first side 206a with copper or other suitable conductive material 804. In FIG. 9, an etch process 902 is used with a etch mask 904 to form the first and second copper coupling structures 210a and 210b shown in FIG. 10. As further shown in FIG. 11, the conductive coupling structures 210a and 210b in one example are formed as conductive strips extending longitudinally across the underlying apertures 208a and 208b, respectively, for electromagnetically coupling with the interior of the waveguide cavity 203. In subsequent packaging with a host transceiver 230 (e.g., FIG. 2), the coupling structures 210 can be electrically coupled with an input 233 and 238 using any suitable flip chip, wire bonding, or other electrical interconnection technique, to provide a simple and cost-effective packaging assembly with the finished gas cell structure 201 mounted to a host integrated circuit package or printed circuit board (not shown). In operation, the first coupling structure 210a receives the transmit signal TX from the output 233 of the transceiver 230 and produces a magnetic field, which is directed through the aperture 208a to the dipolar molecule gas inside the sealed cavity 203.

Figure 10:
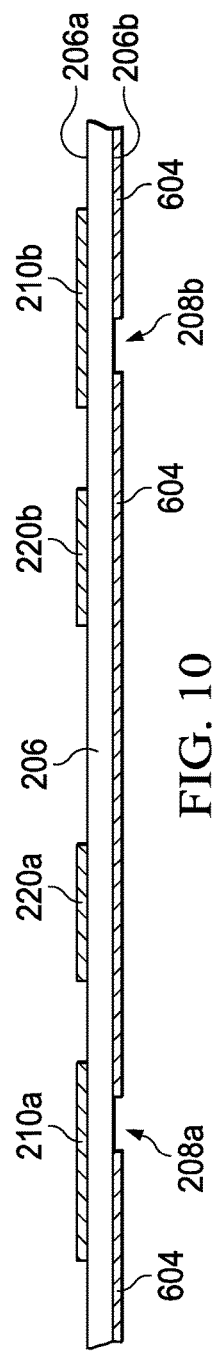
FIG. 10 is a partial side elevation view of the second substrate before bonding with the first substrate.
Figure 11:
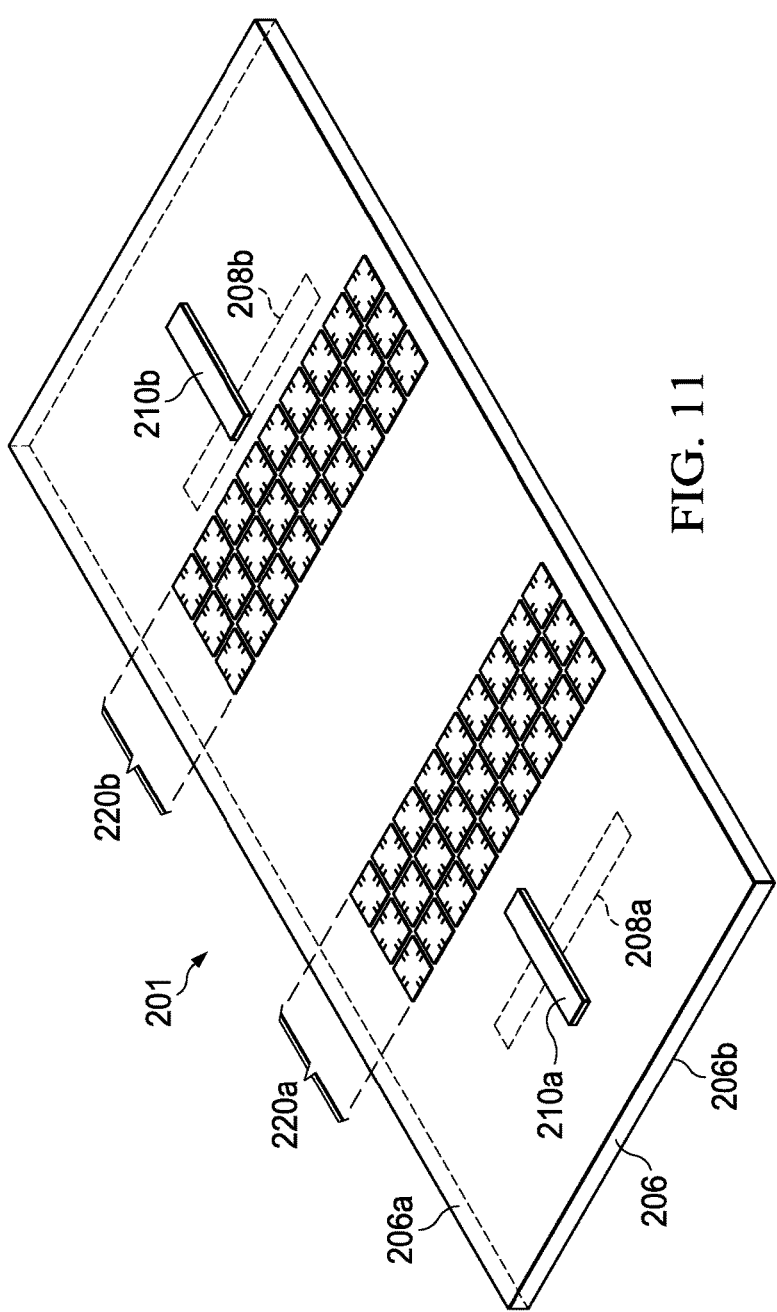
FIG. 11 is a perspective view of the second substrate before bonding with the first substrate.

In this example, as further shown in FIGS. 9-11, the topside of the second substrate also includes patterned conductive electronic bandgap (EBG) structures 220 (FIGS. 10 and 11) formed on the outer surface 206a of the gas cell 201 via the etch mask 904 in FIG. 9. The EBG structures 220 can be omitted in other examples. In FIGS. 2 and 9-11, the EBG structures 220 are spaced from the conductive coupling structures 210 to avoid or mitigate propagation of spurious surface waves. In the example of FIG. 11, first and second EBG structures 220a and 220b each include three rows of several repeating patterns of conductive material 804, where any suitable pattern can be used for attenuating electromagnetic wave coupling along the first side 206a of the second substrate 206 of a given target bandgap range of frequencies, with the EBG structures 220 spaced from and disposed between the transmit and receive coupling structures 210a and 210b. In other examples, only a single EBG structure 220 is used, spaced from and between the coupling structures 210a and 210b. Other possible examples include more than two EBG structures 220 for attenuating electromagnetic genetic wave coupling along the first side 206a. The EBG structures 220 are omitted in other examples.

As shown in the example second substrate 206 of FIG. 11, the apertures 208 and the coupling structures 210 are both extended rectangular shapes, although other shapes and relative positions can be used in other examples. In various examples, the apertures 208 can be either perpendicular or parallel to the direction of propagation of the TE10 mode within the cavity 203. Because the transceiver circuit 230 provides high frequency TX signals to the gas cell 201 (e.g., 100-1000 GHz in various examples), and because the second substrate 206 has a thickness of fractions of a wavelength in some examples, surface waves can: propagate along a grounded dielectric slab or along the top surface 206a of the cell 201; and couple between the input and output apertures 208 of the waveguide, thereby creating a second path for the signal that does not pass through the gas cell cavity 203. In operation, such extra-cavity transmission can mask the absorption of the dipolar molecule gas within the cavity 203.

Accordingly, some examples include one or more EBG structures 220 to mitigate such surface waves through operation as a photonic bandgap structure. In one example, the EBG structure 220 has a bandgap tuned in an expected operational range of frequencies (for interrogating the gas cell 201), such as to mitigate or prevent surface wave propagation. The EBG is a tuned filter including: the parallel combination of the conducting layer 904 on the second or bottom side 206b of the second substrate 206; and the patterned array of repeating unit cells 220 on the first or top side 206a. In the illustrated examples, no vias are required, but vias can be used in other examples. In one example, the waveguide cavity 203 is etched with a top width of 1.5 mm and an etch depth of 0.5 mm to provide a propagation constant and cutoff for the first three modes, which are: (a) a first mode beginning at 120 GHz; a second mode beginning at 230 GHz; and a third mode beginning at 290 GHz. In one example, the cavity 203 is designed for operation in a frequency range where only the first mode can propagate (which can be tuned by changing the waveguide dimensions in other examples). In this example, a band gap of frequencies ranges from 160-195 GHz, at which no mode can propagate along the top side 206a, with the EBG arrays 220 being placed between the two ports of the waveguide to prevent a second path for the electromagnetic signal in the bandgap of interest.

Figure 14:
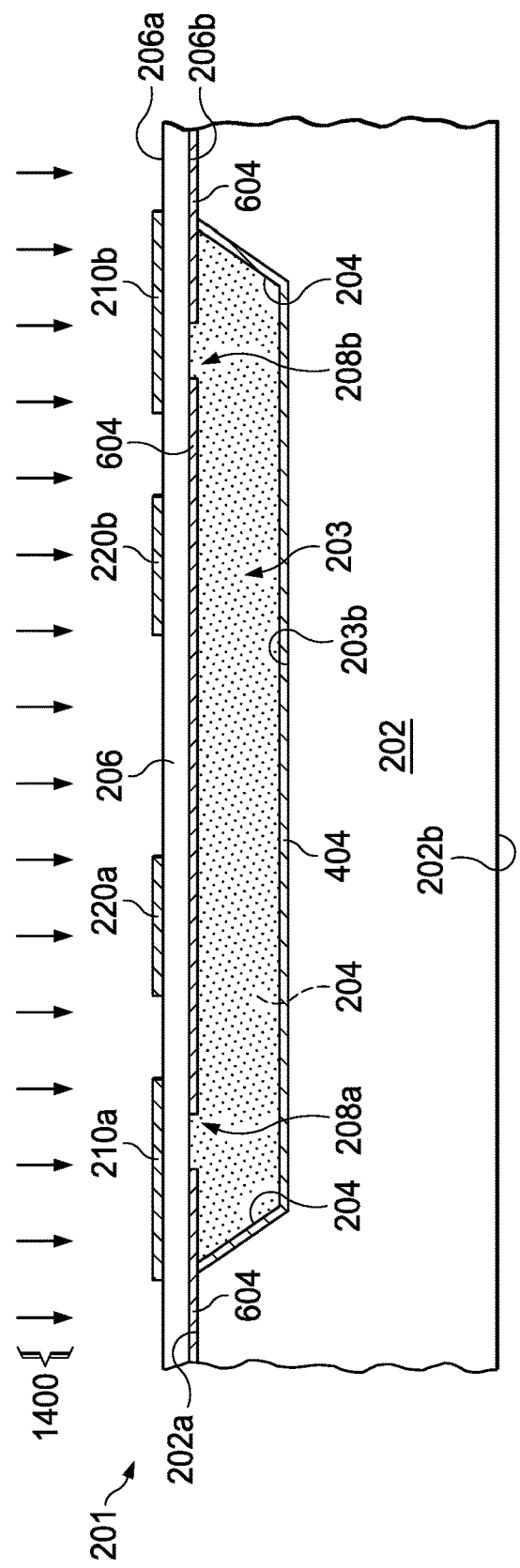
FIG. 14 is a partial side elevation view of the sealed cavity undergoing an activation operation to release a desired target gas inside the sealed cavity.

Referring also to FIGS. 12-14, the method 100 in FIG. 1 also generates a desired target gas inside a sealed cavity, including: providing a nonvolatile precursor material in the cavity 203 at 112 (e.g., precursor material 1202 in FIG. 12); sealing the cavity 203 at 114 by bonding the second substrate 206 to the first substrate 202 with the nonvolatile precursor material 1202 in the sealed cavity (bonding process 1300 in FIG. 13); and concurrently or thereafter activating (e.g., decomposing) the precursor material 1202 at 116 to release a desired target gas inside the sealed cavity 203 (activation process 1400 in FIG. 14). The precursor 1202 can be provided as a solid or solution by any suitable process 1200, such as being inserted or deposited as a solid tablet structure or as a uniform film as shown in FIG. 12. Moreover, a variety of different activation processes 1400 can be used, such as thermal heating or irradiation of the sealed cavity to cause a reaction inside the sealed cavity 203 (e.g., thermolysis and/or hydrolysis or other depolymerization or decomposition).

Some examples include performing an atomic layer deposition (ALD) or molecular layer deposition (MLD) process 1200 at 112, where the process 1200 deposits the nonvolatile precursor material 1202 on an interior face 203b, 204 of the cavity 203 before bonding 114 the first and second substrates 202, 206. In some examples, the ALD or MLD process 1200 deposits a partially complete oxide film in the cavity. When a partially complete oxide film is heated after or during cavity sealing above the dehydration or decomposition temperature, it can release a measured amount of target gas to the cavity 203. In further examples, the ALD or MLD process 1200 includes reacting an organometalic compound with water to form a partially complete metal oxide precursor material 1202 on the interior face 203b, 204 of the cavity 203 before bonding 114 the first and second substrates 202, 206. In some examples, the nonvolatile precursor material 1202 is a solid dielectric precursor material 1202 deposited in the cavity 203 at 112, before bonding 114 the first and second substrates 202, 206.

In further examples, when organometallic compounds or other precursors 1202 are subjected to thermolysis and/or hydrolysis, they release the desired gasses, and water may be provided. In one example, the ALD or MLD process 1200 includes reacting an organoaluminum compound with water to form a partially complete aluminum oxide AlOx precursor material 1202 on the interior face 203b, 204 of the cavity 203, before bonding the first and second substrates 202, 206. In one implementation, the precursor material 1202 is activated at 116 by heating the sealed cavity 203 to release the desired target gas inside the sealed cavity 203. In another example, providing the nonvolatile precursor material 1202 in the cavity 203 at 112 includes: dissolving the precursor material 1202 in a carrier solvent; dispensing the dissolved precursor material 1202 onto an interior face 203b, 204 of the cavity 203; and at least partially drying the dissolved precursor material 1202 on the interior face 203b, 204 of the cavity 203, before the cavity 203 is sealed at 114. The described techniques provide well-defined quantities of material within the waveguide cavity 203 at 112, producing anticipated amounts of the target gasses after sealing and activation at 114 and 116.

In one example, performing the ALD or MLD process 1200 at 112 includes reacting trimethylaluminum (e.g., $Al_2(CH_3)_6$, abbreviated as $Al_2Me_6$ or TMA) with water at a temperature of approximately 200 degrees C. or less (e.g., as low as 100 degrees C.) to form a partially complete aluminum oxide AlOx precursor material 1202 on the interior face 203b, 204 of the cavity 203, before bonding 114 the first and second substrates 202, 206 at 114. In this example, the AlOx precursor material 1202 is activated after cavity sealing, by heating the sealed cavity 203 at a temperature of approximately 350 degrees C. or more to release a desired $H_2O$ target gas inside the sealed cavity 203 through further thermolysis and/or hydrolysis (e.g., dehydration) of the deposited film 1202. In one example, a layer-by-layer ALD or MLD process 1200 facilitates control of the deposition conditions to facilitate a repeatable desired post-activation vapor pressure and cavity gas content. In other example implementations, the bonding process temperature is compatible with the acceptable range of temperatures at which the precursor releases the desired gas, so the activation can be at least partially concurrent with the bonding step. For example, a thermal bonding process can at least partially release desired spectroscopic target gas inside the chambers during sealing. If complete activation is achieved during the bonding stop at 114, then further activation processing at 116 can be omitted in some examples. In other examples, a partial gas activation at 114 is combined with a subsequent dedicated activation step at 116, by thermal, photochemical and/or radiation processing to complete the target gas activation.

Other examples include placing a solid polymer precursor material 1202 in the cavity 203 at 112, before bonding 114 the first and second substrates 202, 206 at 114. Some examples include placing a solid polymeric precursor of rigid rotor molecules 1202 in the cavity 203, before bonding 114 the first and second substrates 202, 206. One such example uses polymers of rigid rotor molecules, such as hydrogen cyanide (HCN), cyanoacetylene ($C_3HN$), pentadienenitrile ($C_5H_5N$, or penta-2,4-diyn-1-nitrile, etc.), which are activated (e.g., heated) at 116 to release small amounts of monomer by thermal depolymerization. Another example uses polymeric precursors of rigid rotor molecules (such as aldoxime ethers, aldoxime esters), which cleanly yield the desired target gasses upon thermolysis.

Some examples include placing a solid aldoxime ether or aldoxime ester precursor material 1202 (e.g., an oxime formed by reaction between hydroxylamine and an aldehyde) in the cavity 203, before bonding 114 the first and second substrates 202, 206. These polymer precursor examples can be activated, such as by heating the sealed cavity 203 to release the desired target gas via thermolysis inside the sealed cavity 203. Further examples include polymeric precursors that eliminate other rigid rotors molecules (such as OCS and $SO_2$) upon thermolysis. These may be bicyclic or tricyclic compounds and/or suitable polymers of such compounds.

Any suitable cavity bonding processing can be used at 114 (FIG. 1) to seal the cavity 203. In one example, the cavity sealing or bonding at 114 includes bonding the bottom side 206b of the second substrate 206, via a bonding process 1300 of FIG. 13 at a low ambient pressure, to the first side 202a of the first substrate 202 to form a sealed cavity 203 including the precursor 1202. The bonding process 1300 can be any suitable wafer bonding step(s) that do(es) not introduce any unwanted gases inside the cavity 203 and seal(s) the cavity 203 with a low internal pressure. Suitable metal bonding process examples 1300 include forming solid-liquid inter diffusion (SLID) bonds or transient liquid phase (TLP) bonds, such as bonds formed at one lower temperature and having a remelting temperature much higher than the temperature at which they are formed. Common TLP bonded metal couples include Au/In, Cu/Sn, Sn/Au, Sn/Ag, where the metal couple can be selected for convenience and overall compatibility with the final device geometry. In some examples, the cavity pressure has a range of Microtorr to Millitorr, so the substrates 202 and 206 are bonded and sealed at 112 in a processing chamber capable of providing and controlling both heat and vacuum. Suitable processing chambers for the bonding process 1300 are commercially available from suppliers such as Electronic Visions Group (EVG), Austria. The substrates 202 and 206 are placed in the chamber, and a suitable vacuum headspace with a small partial pressure is established. The substrates 202 and 206 are then bonded according to a corresponding suitable temperature profile for creating an impermeable seal of each separate cavity 203 of a processed wafer, with all cavities being bonded essentially concurrently at the wafer level. In an alternative implementation, the cavities 203 may be sequentially sealed by apparatus (not shown), which uses laser radiation to locally heat the bonding regions to the suitable temperature, while maintaining a lower temperature of the surrounding die.

A heating or irradiating activation is performed at 116 in FIG. 1, and the devices containing the desired concentration of low-pressure gas are singulated using suitable semiconductor dicing techniques at 118. The finished gas cells 201 (physical cells) are then available for further processing, such as pick-and-place or connection via wire bonding to other microwave devices for a fully integrated system solution. The methods described herein facilitate application of precursors in known amounts that will yield known pressures of gasses at the desired conditions, and they also facilitate tuning of the gas pressure within the cavity to maximize the Q-factor of the observed resonances. Moreover, some examples avoid handling of toxic or dangerous components, so gas amounts are metered to provide control in manufacturing.

FIG. 2 shows a clock apparatus or system 200 including a gas cell structure 201, referred to herein as a physical cell, formed in this example from first and second substrates 202 and 206. The cell 201 includes a chamber or cavity 203 with a sealed interior enclosing a dipolar molecule material gas, such as water ($H_2O$) or any other dipolar molecule gas at a relatively low gas pressure inside the cavity 203. Examples of suitable electrical dipolar material gases include water, acetonitrile ($CH_3CN$) and hydrogen cyanide (HCN). As shown in FIG. 2, the clock 200 further includes: a transceiver 230 with a transmit output 233 for providing an electrical transmit signal (TX) to the gas cell 201; and a receiver input 238 for receiving an electrical input signal (RX) from the gas cell 201. Unlike electronic transition gas cells, the rotational transition gas cell structure 201 does not require optical interrogation, and instead operates through lower frequency electromagnetic interrogation via the transmit and receive signaling TX, RX provided by the transceiver 230.

The sealed cavity 203 includes: a conductive interior cavity surface; and first and second non-conductive apertures 208a and 208b formed in the interior cavity surface for providing an electromagnetic field entrance and an electromagnetic field exit, respectively. In one example, the apertures 208 magnetically couple into the TE10 mode of the waveguide cavity 203. In other examples, the apertures 208 excite higher order modes. A first conductive coupling structure 210a is formed on an outer surface 206a of the gas cell 201 proximate the first non-conductive aperture 208a. In the example 200, the first coupling structure 210a is a conductive strip formed on the upper surface 206a of the upper substrate 206, which overlies (e.g., and crosses over) the corresponding first non-conductive aperture 208a for providing an electromagnetic interface to couple a magnetic field into the interior of the cavity 203 based on the transmit signaling TX from the transceiver output 233. A second coupling structure 210b is formed proximate the second non-conductive aperture 208b for providing an electromagnetic field exit from the cavity 203 to couple the electromagnetic field with the transceiver RX input 238. The proximate location of the conductive coupling structures 210 and the corresponding non-conductive apertures 208 advantageously provides electromagnetically transmissive paths through the second or upper substrate 206, which can be any electromagnetically transmissive material. In some examples, one or more conductive electronic bandgap (EBG) structures 220 are formed on the outer surface 206a of the gas cell 201, spaced from the conductive coupling structures 210. In operation, the EBG structures 220 attenuate electromagnetic wave coupling along the gas cell outer surface 206a between the transmit and receive coupling structures 210a and 210b, respectively. In other examples, the EBG structures 220 may be omitted.

A lower side 206b of the second substrate 206 is substantially or completely plated with conductive material (e.g., copper 94 as shown in FIGS. 9-12 described hereinbelow). The apertures 208 are etched to provide non-conductive windows or apertures 208 in the lower second side 206b, with the coupling structures 210 and any included EBG structures 220 being formed of conductive material (e.g., copper) on the upper side 206a of the second substrate 206. One example includes two EBG structure patterns 220a and 220b, which can be any suitable shape and configuration for electromagnetic attenuation on the upper surface 206a of the gas cell 201. The cell cavity 203 is defined by the lower side 206b of the upper substrate 206, and by sidewalls 204 and a cavity bottom 203b formed in the first (lower) substrate 202, which can be any suitable material (such as silicon) as further shown in FIG. 8 described hereinbelow.

In the example of FIG. 2, the first or lower substrate 202 includes a top or first side 202a into which the cavity sidewalls 204 and a cavity bottom 203b are formed, such as by etching (e.g., FIG. 6 described hereinbelow). In this example, the cell cavity 230 extends along a substantially linear axis from a first end to a second end, with: the first aperture 208a proximate the first end; and the second aperture 208b proximate the second end.

A variety of different cavity sizes and shapes may be used in other examples. One suitable example has a generally rectangular cavity shape with a top width of approximately 1.5 mm and an etch depth of 0.5 mm with: (a) a first mode beginning at 120 GHz; (b) a second mode beginning at 230 GHz; and (c) a third mode beginning at 290 GHz. Other shapes, sizes and configurations of cell cavities 203 are possible.

As shown in FIG. 2, the second side 206b of the second substrate 206 is mounted to the first side 202a of the first substrate 202 to form the cavity 203. The cavity 203 includes the sealed interior, with the conductive interior cavity surfaces extending at least partially along the cavity sidewall or sidewalls 204, the cavity bottom 203b and the lower side 206b of the second substrate 206. The lower second side 206b of the second substrate 206 provides a cavity top with a conductive surface 94 (FIG. 10 described hereinbelow). In some examples, the only non-conductive cavity surfaces are the non-conductive apertures 208 on the bottom 206b of the upper substrate 206. Other non-conductive portions are possible within the cavity 203 in some examples. In the illustrated example, the conductive interior cavity surfaces are plated or otherwise provided with copper or other metal material having a thickness greater than a skin depth at the frequency of the transmit output signal TX.

In further examples, the first and second substrates 202 and 206 are joined together by wafer bonding processing (e.g., FIG. 13 described hereinbelow) in a process chamber, with a controlled low-pressure environment to provide the dipolar molecule gas (e.g., $H_2O$) in the cavity 203 during wafer bonding at a pressure of approximately 1 mbar or less. In some examples, the dipolar molecule gas is at a low pressure of approximately 0.1 mbar or less, and approximately 0.01 mbar or more inside the sealed interior of the cavity 203. Generally, the pressure can be tailored for a given design, where the transition width depends primarily on pressure broadening and Doppler broadening. The pressure broadening factor is linear with pressure, whereas the Doppler broadening is constant with pressure. Accordingly, at one desired pressure, further pressure reduction achieves no further transition frequency width reduction due to the Doppler effect, and further pressure reduction would reduce the magnitude of the peak transition, and the width will be the same, thereby degrading detection and transition tracking.

Gettering agents may be introduced during wafer bonding to include getters within the resulting vapor cavity 203, to getter any contaminants that may exist during the wafer bonding process and/or that may leak into the cavity 203 over time.

In some examples, the cell 201 may include pattern heaters with temperature sensors formed on or in the cell bottom 202b for stabilizing the cell temperature. Such heating elements may be operable to boil off any vapor absorbed on the chamber sidewalls 204, thereby facilitating pressure stability in operation.

In some implementations, the transceiver circuit 230 is implemented on or in an integrated circuit (not shown), to which the gas cell 201 is electrically coupled: for transmission of the TX signal via the output 233; and for receipt of the RX signal via the input 238. When powered, the transceiver 230 is operable to: provide an alternating electrical output signal TX to the first conductive coupling structure 210a for coupling an electromagnetic field to the interior of the cavity 203; and to receive the alternating electrical input signal RX from the second conductive coupling structure 210b, representing the electromagnetic field received from the cavity 203. The transceiver circuit 230 is operable to: (a) selectively adjust the frequency of the electrical output signal TX to reduce the electrical input signal RX, by interrogation to operate the clock 200 at a frequency that substantially maximizes the molecular absorption through rotational motor state transitions; and (b) provide a reference clock signal REFCLK to a clock circuit 240 at the frequency of the TX output signal.

In some examples, the transceiver 230 includes a signal generator 232 with an output 233 that is electrically coupled to the first conductive coupling structure 210a for providing the alternating electrical output signal TX, and for providing the reference clock signal REFCLK at the corresponding transmit output frequency. The transceiver 230 also includes a lock-in amplifier circuit 234 with an input 238 that is coupled to the second conductive coupling structure 210b for receiving the RX signal. In operation, the lock-in amplifier provides an error signal ERR representing a difference between the RX signal and the electrical output signal TX. In one example: (a) the lock-in amplifier circuit 234 provides the error signal ERR as an in-phase output; and (b) in response to the error signal ERR, a loop filter or controller circuit 236 provides a control output signal CO to the signal generator 232 for selectively adjusting the TX output signal frequency, in order to maintain this frequency at a peak absorption frequency of the dipolar molecular gas inside the sealed interior of the cavity 203. In some examples, the RF power of the TX and RX loop is controlled, so as to avoid or mitigate stark shift affects.

The electromagnetic coupling via the non-conductive apertures 208 and corresponding conductive coupling structures 210 facilitates electromagnetic interrogation of the dipolar gas within the cell cavity 203, and the system 200 avoids the cost, complexity, power consumption and optical transmission problems associated with conventional electronic transition atomic clock gas cells. In one form of operation, the clock system 200 operates with the signal generator 232 transmitting alternating signals TX at full transmission power at various frequencies within a defined band, around a suspected quantum absorption frequency at which the transmission efficiency of the gas cell 201 is minimal (absorption is maximal). For example, the quantum absorption frequency associated with the dipolar water molecule is 183.31 GHz. When the system operates at the quantum frequency, a null or minima is detected at the receiver via the lock-in amplifier 234, which provides the error signal ERR to the loop filter 236 for regulation of the TX output signal frequency via the control output CO signal provided to the signal generator 232. In the gas cell cavity 203, the rotational quantum frequency of the dipolar molecule gas is generally stable with respect to time (does not degrade or drift over time) and is largely independent of temperature and a large number of other variables. As a result, unlike some electronic transition based atomic clocks, the clock system 200 is not required to include thermal or other stabilizing circuitry.

In one example, the transceiver system 230 operates the signal generator 232 to initially sweep the transmission output frequency through a band that is known to include the quantum frequency of the cell 201 (e.g., transitioning upward from an initial frequency below the suspected quantum frequency, or initially transitioning downward from an initial frequency above the suspected quantum frequency, or other suitable sweeping technique or approach). The transceiver circuit 230 monitors the received energy via the input 238 coupled with (e.g., electrically connected to) the second conductive coupling structure 210b, in order to identify the transmission frequency associated with peak absorption by the gas in the cell cavity 203 (e.g., minimal reception at the receiver). After the quantum absorption frequency is identified, the loop filter or controller 236: (a) moves the source signal generator transmission frequency near that absorption frequency (e.g., 183.31 GHz); (b) modulates the signal at a very low frequency (e.g., left and right along a frequency axis) to regulate operation around a null or minima in the transmission efficiency, representing the ratio of the received energy to the transmitted energy; and (c) provides negative feedback in a closed loop operation to maintain the signal generator 232 operating at a TX frequency that corresponds to the quantum frequency of the cavity's dipolar molecule gas.

Unlike optically interrogated electronic transition type atomic clocks that use alkali metal gas cells, the rotational transition based atomic clock 200 uses the rotational transition of dipolar molecules (e.g., water) whose frequency of quantum transition is in the sub-THz range. In at least some electronic transition type atomic clocks, the alkali metal gas is excited with a laser operating at hundreds of THz (wavelengths in hundreds of nanometers). In contrast, the millimeter wave clock 200 interrogates the gas with mm-wave radiation induced by a RF transceiver circuit 230. In some examples, the clock 200 can lock-in to the rotational quantum molecular transition with typical Alan deviation of 1e-10 to 1e-11 over 100 seconds averaging. In further examples, the rotational transition based atomic clock apparatus 200 works at sub-THz frequency and is therefore a simpler, lower cost and lower power solution for providing a stable reference clock signal.

In steady state operation, the lock-in amplifier 234 and the loop filter 236 maintain the transmitter frequency at the peak absorption frequency of the cell gas. In one example, the loop filter 236 provides PID control using a derivative of the frequency error as a control factor for lock-in detection and closed loop regulation. At the bottom of the null in the transmission, the derivative is zero and the loop filter 236 feeds the derivative back as a DC control output signal CO to the signal generator 232. This closed loop operates to keep the signal generator transmission output frequency at the peak absorption frequency of the cell gas, using lock-in differentiation based on the RX signal received from the cell 201. As shown in FIG. 2, further clock circuitry 240 receives a reference clock signal REFCLK for use by frequency dividers to generate system clocks in a host system (not shown).

These described examples are useful to fabricate mm-wave atomic clocks 200 and rotational transition gas cells 201 therefor, with simple cost-effective and low power operation using rotational quantum transition of low-pressure gas molecules to provide a reference clock signal REFCLK, while avoiding the complexity, power consumption, cost and size shortcomings of conventional atomic clocks that use electronic transitions for establishing a reference. The rotational transition-based atomic clock techniques described herein are stable with temperature variations, and can be manufactured using chip-scale or wafer-scale processing technology. Furthermore, the clocks 200 operate at much lower frequencies than electronic transition devices to ascertain and lock-in to the rotational quantum state of a low-pressure dipolar molecule vapor, and these described techniques avoid problems associated with providing a clear optical transmission path in conventional optically interrogated gas cells. Furthermore, the gas cells 201 can be used with a variety of low-cost mm-wave CMOS transceiver circuits 230 to interrogate the low-pressure dipolar molecule gas in the physical cell 201 over a bandwidth that covers the transition. Furthermore, water and other dipole molecule gases exhibit detectable absorption changes at the transition frequency to facilitate lock-in for providing a stable reference clock signal. Also, in some examples, the gas cell 201 and the overall atomic clock system 200 can be constructed and packaged within a silicon fabrication and packaging process. Furthermore, the chip-scale dipolar molecule gas cells 201 can be used in atomic clocks and other applications involving rotational spectroscopy, and they provide a more compact design than other rotational spectroscopy solutions.

Modifications are possible in the described embodiments, and other embodiments are possible, within the scope of the claims.

What is claimed is:

1. A method of fabricating a gas cell, the method comprising:
    forming a cavity in a first side of a first substrate;
    forming a conductive material on at least one sidewall and a bottom of the cavity;
    providing a nonvolatile precursor material in the cavity of the first substrate, including placing a solid polymer precursor material in the cavity;
    after providing the nonvolatile precursor material in the cavity of the first substrate, bonding a second substrate to the first side of the first substrate to form a sealed cavity including the nonvolatile precursor material in the cavity; and
    activating the precursor material after or during forming the sealed cavity to release a target gas inside the sealed cavity.

2. The method of claim 1, wherein providing the nonvolatile precursor material in the cavity includes placing a solid polymeric precursor which eliminates other rigid rotor molecules in the cavity.

3. The method of claim 1, wherein activating the precursor material includes heating the sealed cavity to release the target gas.

4. The method of claim 1, wherein activating the precursor material includes irradiating the sealed cavity to release the target gas.

5. The method of claim 1, herein providing the nonvolatile precursor material in the cavity includes providing a solid dielectric precursor material in the cavity before bonding the first and second substrates.

6. The method of claim 1, wherein providing the nonvolatile precursor material in the cavity includes placing a solid polymeric precursor of rigid rotor molecules in the cavity.

7. The method of claim 6,
    wherein providing the nonvolatile precursor material in the cavity includes placing a solid hydrogen cyanide, cyanoacetylene, or pentadienenitrile precursor material in the cavity before bonding the first and second substrates; and
    wherein activating the precursor material after forming the sealed cavity includes heating the sealed cavity to release the target gas as a monomer by thermal depolymerization inside the sealed cavity.

8. The method of claim 6, wherein providing the nonvolatile precursor material in the cavity includes placing a solid aldoxime ether or aldoxime ester precursor material in the cavity before bonding the first and second substrates; and
    wherein activating the precursor material after forming the sealed cavity includes heating the sealed cavity to release the target gas by thermolysis inside the sealed cavity.

9. The method of claim 1, further comprising, before bonding the first and second substrates:
    forming a conductive material on a bottom side of the second substrate;
    etching first and second spaced apertures through the conductive material on the bottom side of the second substrate;
    forming first and second conductive coupling structures on a top side of the second substrate; and
    bonding the bottom side of the second substrate to the first side of the first substrate to form the sealed cavity.

10. The method of claim 9, wherein providing the nonvolatile precursor material in the cavity includes performing an atomic layer deposition (ALD) or molecular layer deposition (MLD) process which deposits the nonvolatile precursor material on an interior face of the cavity before bonding the first and second substrates.

11. The method of claim 10,
    wherein performing the ALD or MLD process includes reacting an organometalic compound with water to form a partially complete metal oxide precursor material on the interior face of the cavity before bonding the first and second substrates; and
    wherein activating the precursor material after forming the sealed cavity includes heating the sealed cavity to release the target gas inside the sealed cavity.

12. The method of claim 11, wherein performing the ALD or MLD process includes reacting an organoaluminum compound with water to form a partially complete aluminum oxide precursor material on the interior face of the cavity before bonding the first and second substrates.

13. The method of claim 11,
wherein performing the ALD or MLD process includes reacting trimethylaluminum with water at a first temperature of approximately 200 degrees C. or less to form a partially complete aluminum oxide precursor material on the interior face of the cavity before bonding the first and second substrates; and
wherein activating the precursor material after forming the sealed cavity includes heating the sealed cavity at a second temperature of approximately 350 degrees C. or more to release the target gas inside the sealed cavity.

14. The method of claim 1, wherein providing the nonvolatile precursor material in the cavity includes, before bonding the first and second substrates:
dissolving the precursor material in a carrier solvent;
dispensing the dissolved precursor material onto an interior face of the cavity; and
at least partially drying the dissolved precursor material on the interior face of the cavity.

15. The method of claim 14, wherein providing the nonvolatile precursor material in the cavity includes placing a polymeric precursor which eliminates other rigid rotor molecules in the cavity before bonding the first and second substrates.

16. The method of claim 14, wherein providing the nonvolatile precursor material in the cavity includes placing a polymeric precursor of rigid rotor molecules in the cavity before bonding the first and second substrates.

17. The method of claim 16,
wherein providing the nonvolatile precursor material in the cavity includes placing a hydrogen cyanide, cyanoacetylene, or pentadienenitrile precursor material in the cavity before bonding the first and second substrates; and
wherein activating the precursor material after forming the sealed cavity includes heating the sealed cavity to release the target gas as a monomer by thermal depolymerization inside the sealed cavity.

18. The method of claim 16,
wherein providing the nonvolatile precursor material in the cavity includes placing an aldoxime ether or aldoxime ester precursor material in the cavity before bonding the first and second substrates; and
wherein activating the precursor material after forming the sealed cavity includes heating the sealed cavity to release the target gas by thermolysis inside the sealed cavity.

* * * * *